(12) United States Patent
Guo et al.

(10) Patent No.: US 6,296,712 B1
(45) Date of Patent: Oct. 2, 2001

(54) CHEMICAL VAPOR DEPOSITION HARDWARE AND PROCESS

(75) Inventors: Xin Sheng Guo, Los Altos Hills; Mohan Bhan, Cupertino; Justin Jones, San Francisco; Lawrence Lei, Milpitas; Russell Ellwanger, Carmel; Mei Chang, Saratoga; Ashok Sinha, Palo Alto; Avi Tepman, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/055,689

(22) Filed: Apr. 6, 1998

Related U.S. Application Data

(60) Provisional application No. 60/067,130, filed on Dec. 2, 1997.

(51) Int. Cl.[7] .................................................... C23C 16/00
(52) U.S. Cl. .................... 118/728; 118/500; 118/715; 204/298.07; 204/298.11; 204/298.15
(58) Field of Search .................................. 118/715, 728, 118/729, 730, 500; 204/298.07, 298.11, 298.15

(56) References Cited

U.S. PATENT DOCUMENTS

| | | | |
|---|---|---|---|
| 5,304,248 | 4/1994 | Cheng et al. ........................ | 118/728 |
| 5,447,570 | 9/1995 | Schmitz et al. ...................... | 118/728 |
| 5,476,548 | 12/1995 | Lei et al. .............................. | 118/728 |
| 5,578,532 | 11/1996 | van de Ven et al. ................. | 437/245 |
| 5,620,525 | 4/1997 | van de Ven et al. ................. | 118/728 |
| 5,679,405 | 10/1997 | Thomas et al. ..................... | 427/248.1 |
| 5,695,568 | * 12/1997 | Sinha et al. ......................... | 118/729 |
| 5,766,363 | * 6/1998 | Mizuno et al. ...................... | 118/725 |
| 5,800,686 | * 9/1998 | Littau et al. ..................... | 204/298.07 |
| 5,882,417 | * 3/1999 | van de Ven et al. ................. | 118/728 |
| 5,882,419 | * 3/1999 | Sinha et al. ......................... | 118/729 |
| 5,888,304 | * 3/1999 | Umotoy et al. ..................... | 118/720 |
| 5,985,033 | * 11/1999 | Yudovsky et al. .................... | 118/715 |

FOREIGN PATENT DOCUMENTS

| | | | |
|---|---|---|---|
| 0 698 673 A1 | 2/1996 | (EP) | C23C/16/44 |
| 0 698 674 A2 | 2/1996 | (EP) | C23C/16/44 |

* cited by examiner

*Primary Examiner*—Paul Thibodeau
*Assistant Examiner*—Monique R. Jackson
(74) *Attorney, Agent, or Firm*—Thomason, Moser & Patterson, L.L.P.

(57) ABSTRACT

The invention provides a substrate support member and a purge guide for directing purge gas past the edge of a substrate and towards the outer perimeter of the chamber. The purge guide includes a plurality of holes disposed around the inner perimeter thereof to provide a purge gas passage and to prevent purge gas from interfering with the deposition chemistry on the surface of the substrate. A substrate support member is also provided having a vacuum chuck for securing a substrate to the upper surface thereof. The substrate support member preferably includes a shoulder on which the purge guide is supported during processing. The invention also provides a method for shielding an edge of a substrate by flowing a purge gas adjacent the edge of the substrate and then through a plurality of purge holes on a purge guide.

40 Claims, 5 Drawing Sheets

CHEMICAL VAPOR DEPOSITION HARDWARE AND PROCESS

This application claims the benefit of U.S. Provisional Application No. 60/067,130, filed Dec. 2, 1997.

BACKGROUND OF THE INVENTION

1. Field of the Invention

The present invention relates to a processing system for manufacturing integrated circuits (ICs) and flat panel displays. More specifically, the invention relates to a susceptor and purge guide used to support a substrate in a processing system and prevent backside deposition on the substrate.

2. Background of the Related Art

Integrated circuits and flat panel displays are typically fabricated by depositing multiple layers of materials such as metals and dielectrics on a substrate and patterning the layers to form various structures. In the majority of applications, a single substrate such as a 100 mm, 200 mm or 300 mm substrate is used to form multiple die thereon. The trend has been to increase the size of the substrate while reducing the size of the devices so that more devices are formed on a single substrate. As a result, one important aspect of IC and flat panel display fabrication is to improve uniformity of deposited materials across the surface of the substrate and to reduce the overall edge exclusion which cannot be used to form viable die.

It is desirable to exclude deposited materials from the backside of the substrate, as well as from the edges of the substrate, to prevent the substrate from adhering to the susceptor on which it is supported during processing and to prevent material from depositing on areas of the substrate where the material may not adhere or be subject to flaking. Both backside deposition, as well as deposition on the edge of the substrate, may also result in particle formation in the system.

To combat the problems of backside deposition and edge deposition, purge gases delivered from the backside of the substrate and purge guides or rings have been used. One such purge guide is described in U.S. Pat. No. 5,516,367, entitled "Chemical Vapor Deposition Chamber with a Purge Guide", by Lei et al., which is incorporated herein by reference. FIG. 1 is a cross sectional view of a prior art substrate support member 10 and purge guide 12. The purge guide is supported on a shoulder 14 formed on the substrate support member and includes an inner lip 16 which overhangs or contacts the edge of a substrate 18. The inner lip 16 may define a narrow passage between its lower surface and the substrate through which a purge gas is flowed. The purge gas is delivered through the support member to the edge of the substrate having the purge guide supported above the substrate. However, gas flow outwardly through the gap between the purge guide 12 and shoulder 14 of the substrate support member creates a low pressure region which draws the reaction gases to the edge and backside of the substrate and result in unwanted deposition thereon.

One problem encountered with the available purge guides is that the flow rate of the backside gases must be tightly controlled to prevent edge and backside deposition while facilitating deposition uniformity on the substrate surface. The flow rate of purge gas delivered between the purge guide and the substrate must be controlled to prevent adverse effects on deposition uniformity towards the outer edge of the substrate due to the purge gas disrupting process gas flow over the substrate surface.

Another problem encountered is that the requirements of edge exclusion have become more demanding. In the past, it was acceptable for the exclusion area on the perimeter of the substrate to extend up to 6 mm from the substrate edge with ninety percent (90%) film thickness at 6 mm inward from the edge. More recently, the demand has been increased to only 3 mm of exclusion with ninety to ninety-five percent (90–95%) film thickness at 3 mm inward from the edge. Accordingly, the purge guides and purge flow must be adapted to accomplish these increased demands.

Therefore, there is a need for a purge guide and susceptor to support a substrate during processing and to prevent backside and edge deposition with a narrow exclusion width around the perimeter of the substrate.

SUMMARY OF THE INVENTION

The invention generally provides a substrate support member for supporting a substrate during processing and a purge guide for delivering a purge gas to the edge and backside of a substrate to prevent deposition thereon.

In one aspect of the invention, a substrate support member is provided having a shoulder disposed thereon for supporting a heater shield and a purge guide. The heater shield is adapted to align the purge guide with the heater shield and the support member. The inner wall of the shoulder and the purge guide define a purge gas passage which delivers purge gas to the edge of the substrate. The support member also preferably includes a vacuum chuck for securing a substrate to the upper surface of the support member.

In another aspect of the invention, a purge guide is provided having a plurality of angled purge holes for directing purge gas across the edge of a substrate and away from the substrate processing surface. The purge guide preferably includes an inner lip which overhangs the edge of a substrate during processing and an alignment recess formed between an inner and outer base portion. Additionally, support pins may be disposed on the lower surface of the inner base to support the purge guide in a spaced relationship from the support member.

In another aspect of the invention, a processing chamber is provided having a support member and purge guide disposed therein to support a substrate in the chamber and provide a gas barrier wall adjacent the edge of a substrate.

Yet another aspect of the invention provides for a method of shielding an edge of a substrate by providing a purge guide having a plurality of purge holes and flowing a purge gas adjacent the edge of the substrate and then through the purge holes.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DESCRIPTION OF THE PREFERRED EMBODIMENT

Figure 1:
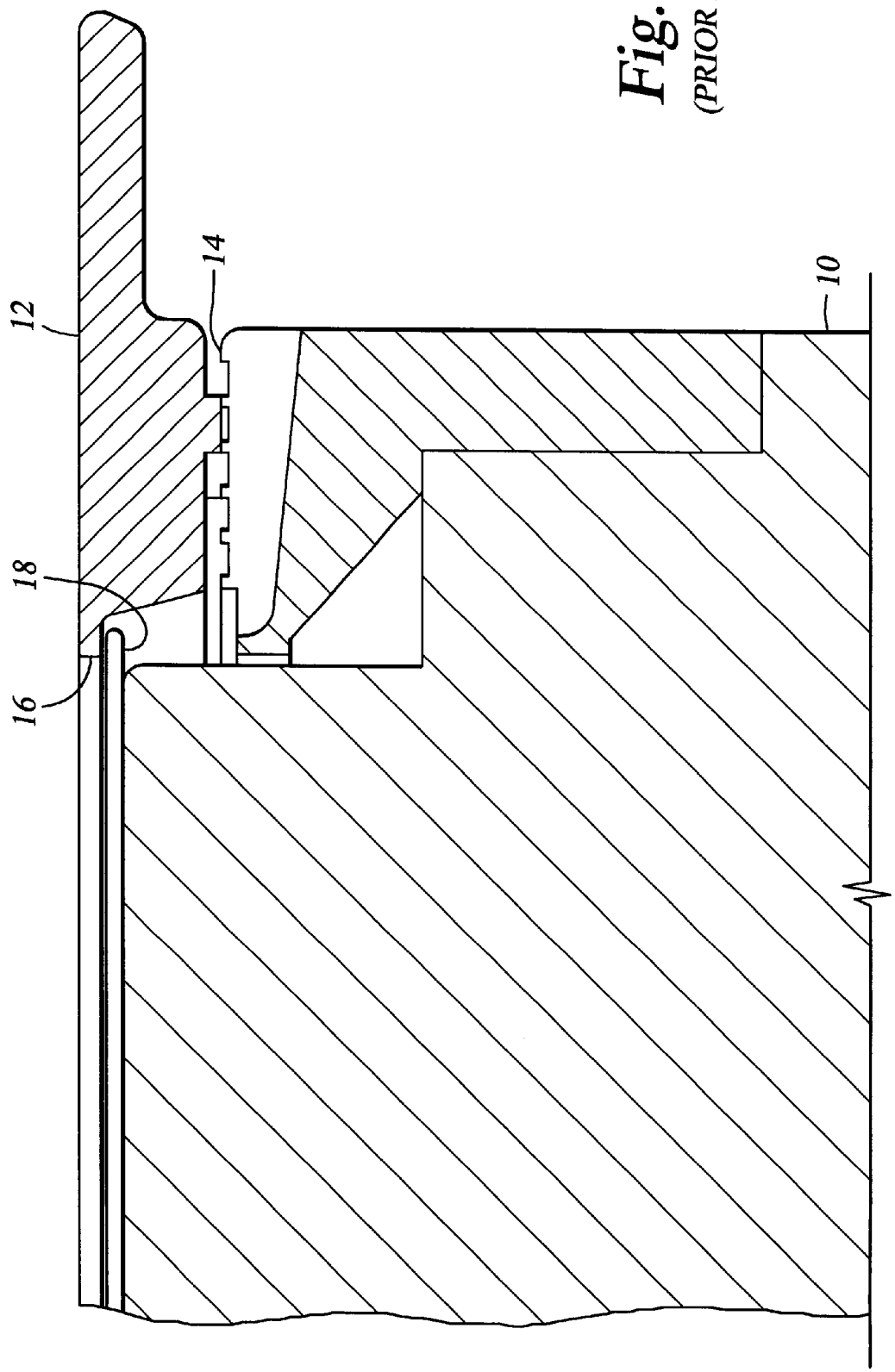
FIG. 1 is a cross sectional view of a prior art apparatus used in CVD processing.
Figure 2:
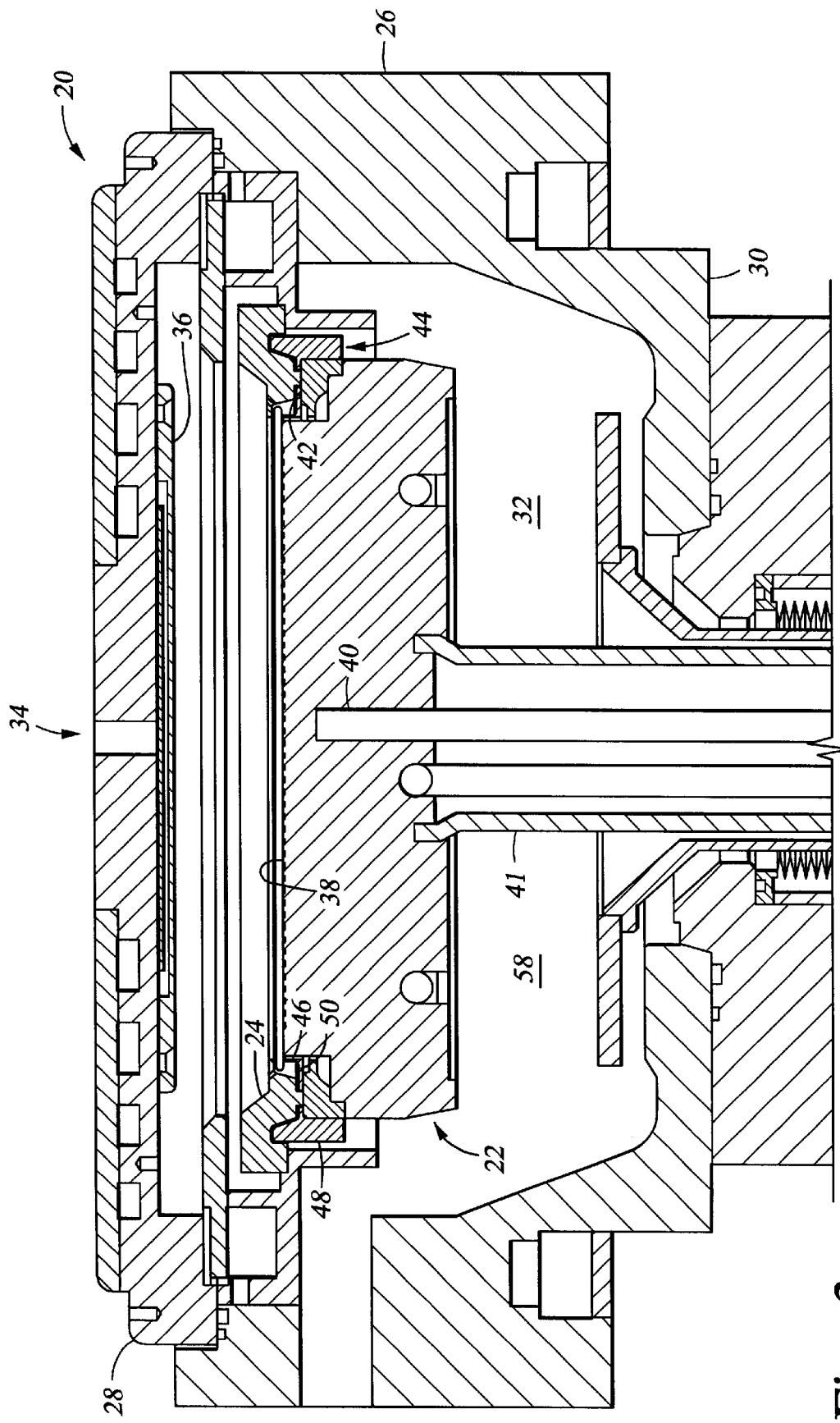
FIG. 2 is a cross sectional view of an apparatus of the invention used in CVD processing.
Figure 3:
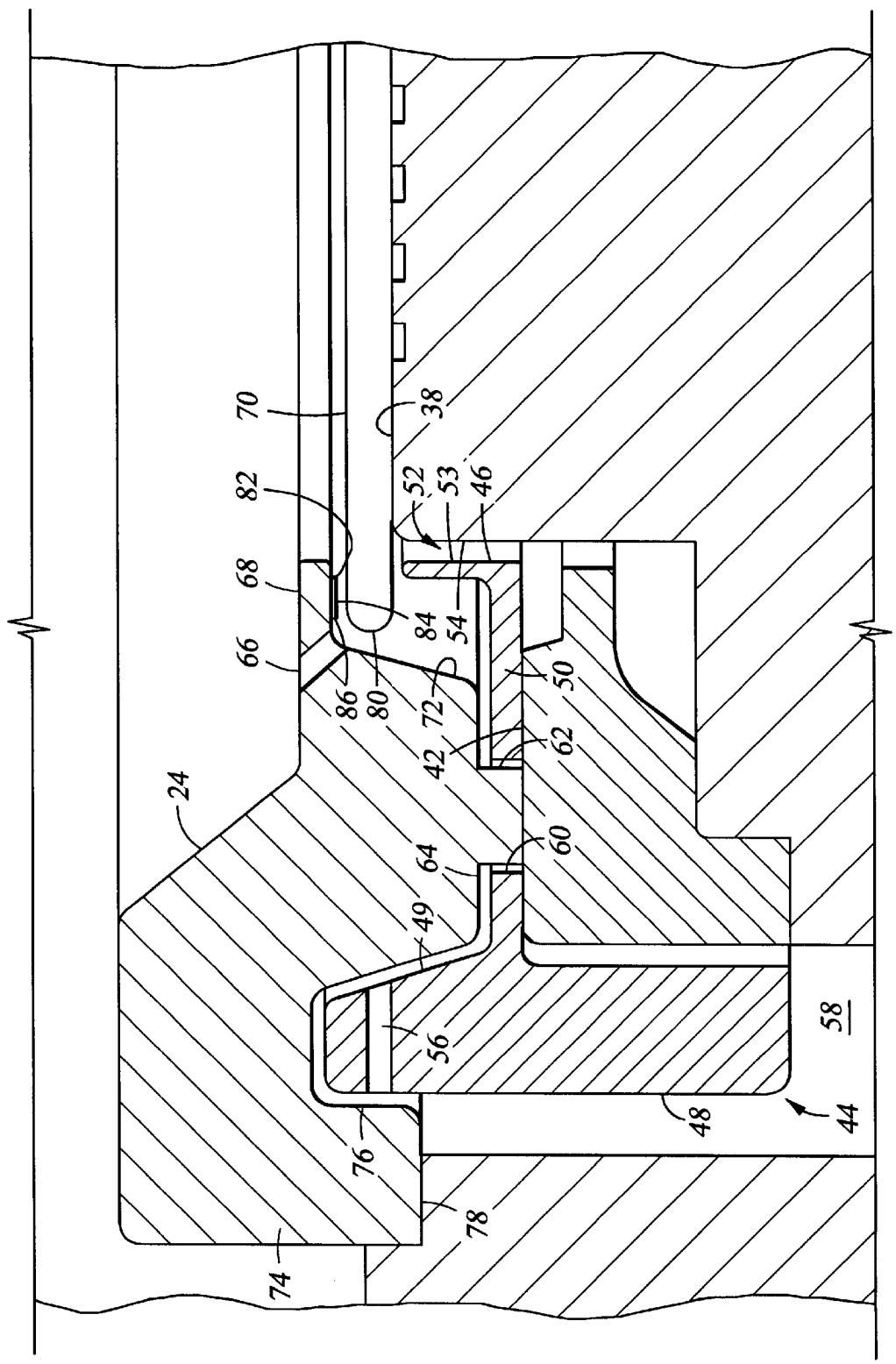
FIG. 3 is an exploded view of a portion of the apparatus shown in FIG. 2.

FIG. 2 is a cross sectional view of a deposition chamber 20 showing a substrate support member 22 and purge guide 24 of the present invention. FIG. 3 is an exploded view of a portion of the apparatus shown in FIG. 2. Generally, the chamber 20 includes sidewalls 26, a lid 28 and a bottom wall 30 which define an enclosure 32. Process gas entering a gas inlet 34 in the lid is discharged into the chamber through a showerhead 36 which, as shown, is positioned in the upper portion of the chamber. The vertically movable substrate support member 22, typically referred to as a susceptor or heater, is disposed through the bottom wall of the chamber and includes an upper surface 38 to support a substrate. Purging gas enters the chamber through a gas channel 40 formed in the substrate support member 22 where it is delivered to the edge of the substrate between the edge of the support member 22 and the purge guide 24. An exhaust system (not shown) exhausts gases from the chamber and provides a vacuum environment for processing.

The substrate support member 22 is formed of an aluminum plate supported in the chamber on a vertical shaft 41. The support member includes a shoulder 42 disposed around its perimeter on which a heater shield 44 is preferably disposed. The heater shield 44 includes an inner vertical wall 46 and an outer vertical wall 48 having a supporting plate 50 disposed therebetween. The inner wall 46 of the heater shield 44 defines a purge gas passage 52 between its outer surface 53 and the outer surface 54 of the support member 22 above the shoulder 42. The heater shield 44 is secured into place on the shoulder of the support member by two or more screws or pins (not shown) that extend downwardly from its lower surface and mate with a companion recess formed on the shoulder of the support member. Preferably, the heater shield 44 is secured to prevent positional movement while allowing radial expansion of the heater shield. The outer wall 48 of the heater shield 44 is disposed adjacent to the outer perimeter of the support member and extends above and below the surface of the shoulder 42 to about the level of the upper surface 38 of the support member on its upper end. The outer wall 48 of the heater shield provides a sloped purge guide alignment surface 49 for aligning the purge guide to the support member. The heater shield is designed to prevent deposition on the support member 22 and to provide a surface which is easily replaced during routine maintenance. The outer wall 48 of the heater shield may define a plurality of vent holes 56 to enable the passage of purge gas therethrough and into the lower portion 58 of the chamber. The supporting plate 50 of the heater shield defines one or more recesses 60 therein to receive one or more alignment pins 62 disposed on the lower surface 64 of the purge guide.

Figure 4:
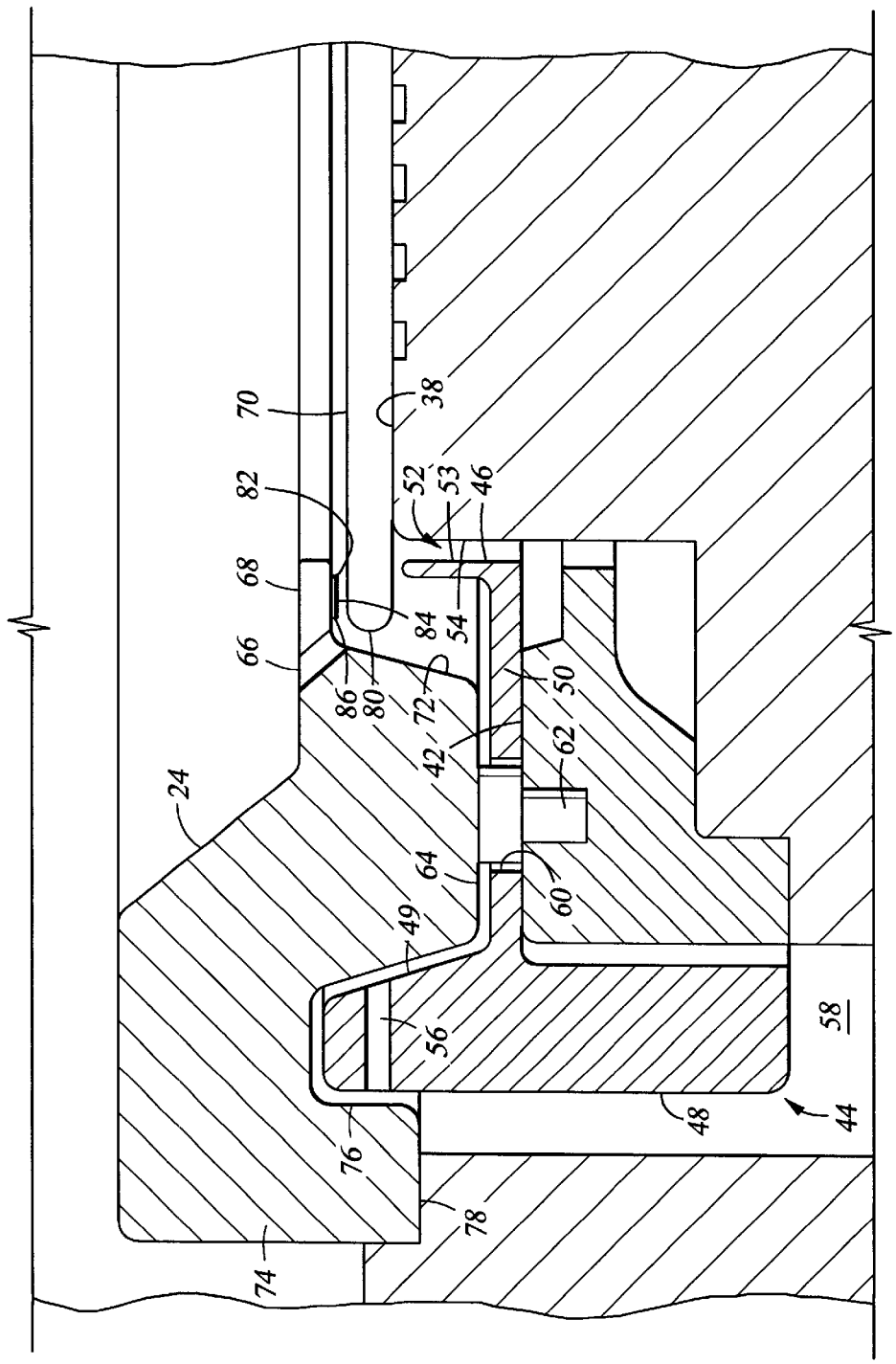
FIG. 4 is a top view of a purge guide of the invention.
Figure 5:
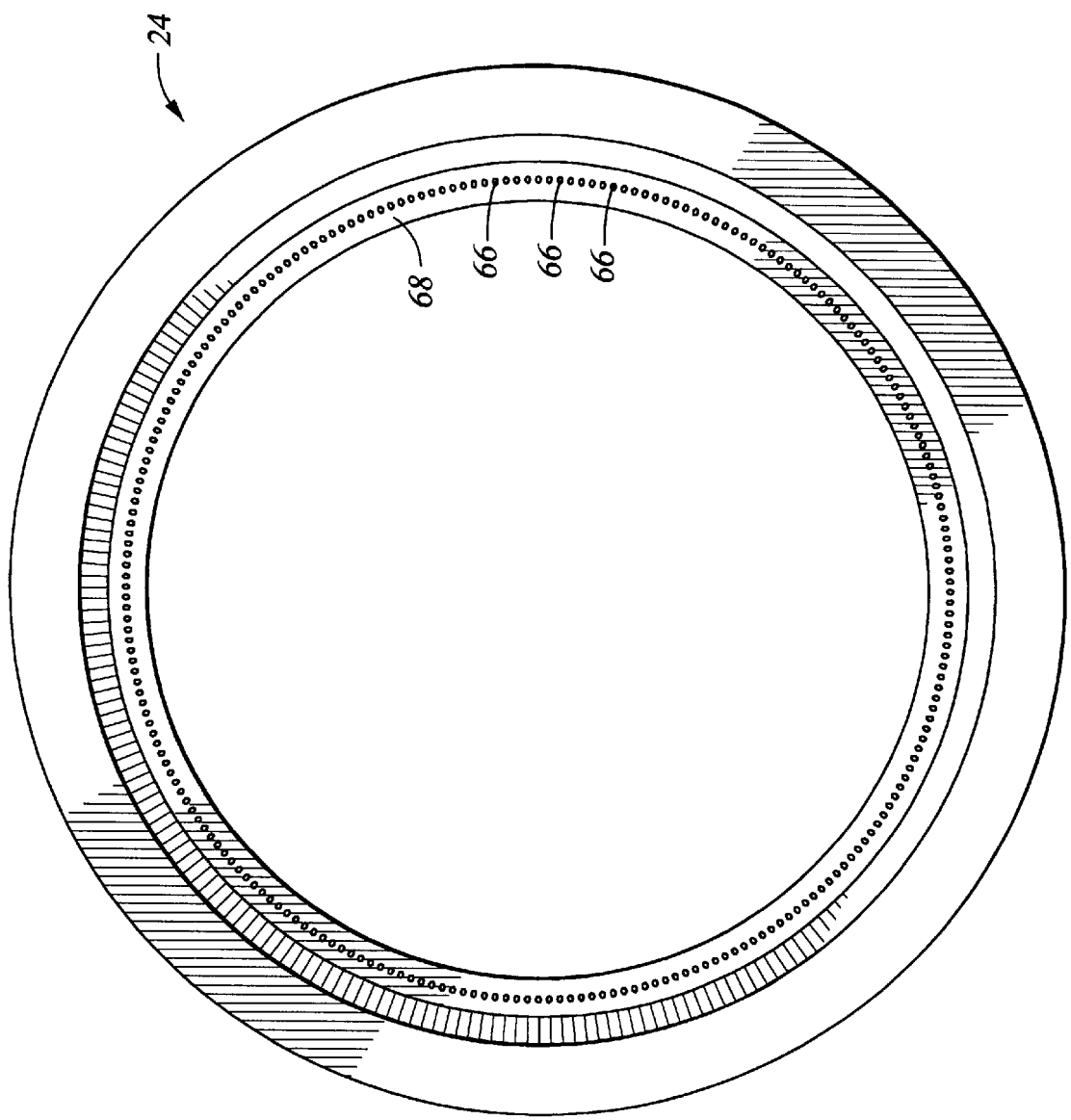
FIG. 5 shows another embodiment of the purge guide of the invention.

The purge guide 24 is generally an annular ring defining a plurality of purge holes 66 disposed around the inner perimeter of the ring as shown in FIGS. 3–5. The ring includes an inner annular lip 68 which is disposed over the edge of a substrate 70 during processing. An inner base portion 72 is supported on the support member shoulder 42 on a plurality of pins 62 either formed on the lower surface 64 of the purge guide 24 and disposed in recesses formed on the heater shield 44 (as shown in FIG. 3) or the support member shoulder 42 (as shown in FIG. 4). An outer base portion 74 is provided to support the purge guide in the chamber when the support member is lowered in the chamber for substrate exchange or when the chamber is idle. A recess 76 is formed in the lower surface 78 of the purge guide between the inner and outer base portions to receive the outer wall 48 of the heater shield 44 when the support member is elevated in the chamber for processing. The recess 76 includes angled surfaces for enabling alignment of the purge guide with the outer wall 48 of the heater shield. As the support member is moved vertically in the chamber, the recess 76 receives the outer wall 48 of the heater shield and aligns itself as the support member continues to move in the chamber. Additionally, the inner surface of the inner base portion 72 is angled to align the substrate with the support member as the purge guide is aligned on the heater shield 44 when the support member moves vertically upward in the chamber.

A number of purge holes 66, preferably about two hundred and forty (240) for a 200 mm substrate application, are formed through the lip 68 of the purge guide 24 at about the point where the edge of a substrate is positioned during processing. The purge holes 66 enable purge gas passage across the edge 80 of the substrate to form a gas barrier wall at about the edge of the substrate. This gas barrier wall prevents deposition gases from passing around the edge of the substrate and onto the backside of the substrate. The purge holes are preferably disposed at an angle between about 30° and about 65° (from the horizontal plane) to route the purge gas from the edge of the substrate towards the outer perimeter of the chamber. The purge guide and the heater shield are preferably made of stainless steel, although other suitable materials may be used.

One or more spacing pads 84 may be disposed on the lower surface 86 of the lip 68 of the purge guide to prevent closure of the gap defined by the lip of the purge guide 68 and the upper surface of the substrate 70. It is preferred that no contact occur between the purge guide and the substrate. However, if the lip of the shadow ring approaches the surface of the substrate, the one or more spacing pads 84 will maintain the integrity of the purge gas passage. The height of the pads is preferably about one (1) to about ten (10) mils.

The support member 22 preferably includes a vacuum chuck to secure the substrate to the support member during processing. While a vacuum chuck is preferred, other types of chucks and securing devices may be used to hold the substrate on the support member. Vacuum chucks enable the substrate to be secured to the support member without contacting the purge guide. Vacuum chucks also have been shown to improve substrate temperature uniformity, improve film uniformity, generate fewer particles in the chamber and prevent bridging between the substrate and the purge guide and the substrate and the support member.

In operation, the purge gas is delivered through the support member to the annular passage 52 formed between the heater shield 44 and the outer surface of the support member 22. The purge gas is delivered through the passage to the backside edge of the substrate 70 and across the edge of the substrate. The majority of the gas then flows out through the purge gas holes 66 disposed through the purge guide 24 at an angle to deliver the gases outwardly away from the edge of the substrate. This outwardly directed purge prevents the purge gas from interfering with the deposition on the substrate. Some of the purge gas may flow beneath the purge guide supported on and spaced from the heater shield 44 and pass through the vent holes 56 in the heater shield to prevent deposition in the lower portion of the chamber. Additionally, a small portion of the gas may flow out into the chamber between the lip of the purge guide 68 and the substrate 70.

The majority of the purge gas flowing through the purge holes 66 provides a gas barrier wall at the edge of the substrate to prevent edge and backside deposition on the substrate. The flow of gas between the lip 68 of the purge guide and the substrate further prevents deposition on the substrate edge. Gas flow through channel 52 also assists in preventing deposition on the backside of the substrate.

The flow rate of the purge gas delivered between the purge guide and the substrate must be controlled to prevent adverse effects on deposition uniformity at the region near the edge of the substrate due to the purge gas disrupting process gas flow over the substrate surface. To provide uniform deposition, the flow rate of the purge gas is typically adjusted according to the size of the gap formed between the purge guide and the substrate. Generally, the purge gas is flowed at a rate between about 100 sccm and about 10,000 sccm, and preferably, the purge gas is flowed at a rate between about 500 sccm and about 3,000 sccm. The gap between the lower surface 86 of the lip 68 of the purge guide and the upper surface of the substrate 70 is preferably maintained between about 5 mils and about 25 mils, even more preferably between about 10 mils and about 20 mils, depending on the flow rate of the purge gas to optimize substrate edge exclusion without sacrificing deposition uniformity. For example, in a processing chamber configured for processing 200 mm substrates having a process gas flow of about 500 sccm and a chamber pressure maintained at about 25 Torr, a gap of about 10 mils is preferably maintained for a purge gas flow rate of about 2200 sccm to achieve a $R_s$ uniformity of 2.5% with complete substrate backside and bevel exclusion and about 1 mm to about 1.5 mm of edge exclusion. $R_s$ uniformity is a measurement of the change in deposition uniformity from the wafer center to the wafer edge. As a second example for the same chamber conditions, a gap of about 20 mils is preferably maintained for a purge gas flow rate of about 1400 sccm to achieve a $R_s$ uniformity of 2.5% with complete substrate backside and edge exclusion.

Substrate temperature is another processing condition which needs to be controlled to achieve uniform deposition because the deposition rate typically varies as a function of the substrate temperature. Generally, the deposition rate increases with increasing substrate temperature. Preferably, the substrate temperature during processing for aluminum deposition is maintained at a temperature of between about 170° C. and about 260° C.

The backside gas pressure on the substrate also affects the temperature uniformity on the substrate which in turn affects the deposition uniformity. Typically, backside gas pressure is maintained between about 1 Torr and about 10 Torr. Varying the backside pressure can change the deposition thickness profile from center thin, edge thick (low backside pressure at <2 T) to center thick, edge thin (high backside pressure at >10 T). Preferably, the backside pressure is maintained by the vacuum chuck between about 1.5 Torr to about 5 Torr to achieve a good $R_s$ uniformity of between about 2% to about 3.5%.

One way to monitor deposition uniformity is to measure the substrate resistance ($R_s$) uniformity expressed in percentage of deviation. Generally, good deposition uniformity is exhibited by a low $R_s$ uniformity percentage of less than about 5% measured at 3 mm physical edge exclusion. Preferably, the $R_s$ uniformity percentage is less than about 3%. To prevent backside and bevel deposition with minimal edge exclusion while achieving acceptable $R_s$ uniformity, the invention provides a purge gas guide having a plurality of purge holes to maintain a purge gas flow adjacent the backside and the edge of the substrate, while minimizing edge exclusion on the substrate surface. However, the flow rate of the purge gas must provide sufficient purge gas concentration adjacent the backside and bevel of the substrate to prevent deposition thereon. To achieve desired edge exclusion and $R_s$ uniformity, the required flow rate must be adjusted depending mainly on the size of the purge holes, the number of purge holes, the angle of the purge holes, and the distance or gap between the substrate and the purge gas guide.

For example, for a purge gas guide having two hundred forty (240) 50mils-diameter, 45° outwardly-angled purge holes positioned at 10 mils above the substrate surface, a purge gas flow greater than about 2,100 sccm is preferable to prevent substrate backside and bevel deposition and to achieve a $R_s$ uniformity of about 3% with about 1 mm edge exclusion. As a second example, for a purge gas guide having one hundred eighty (180) 60mils-diameter, 30° outwardly-angled purge holes positioned at 8 mils above the substrate surface, a purge gas flow greater than about 2,900 sccm is preferred to prevent substrate backside and bevel deposition and to achieve a $R_s$ uniformity of about 4% with about 1mm edge exclusion. Generally, higher purge gas flow and larger gap distance provide more effective prevention of backside and bevel deposition and better substrate edge exclusion. However, the flow rate of the purge gas also affects the $R_s$ uniformity of the resulting film, and generally, a higher purge gas flow rate produces poorer $R_s$ uniformity. Thus, the flow rate of the purge gas is preferably maintained at the minimum necessary to achieve substrate backside and edge exclusion so that the resulting $R_s$ uniformity is optimized.

While the foregoing is directed to the preferred embodiment of the present invention, other and further embodiments of the invention may be devised without departing from the basic scope thereof, and the scope thereof is determined by the claims which follow.

We claim:

1. An assembly for shielding an edge of a substrate, comprising:
    a frame member having a plurality of purge holes disposed through the frame member to enable purge gas flow therethrough;
    an inner lip portion defining an inner opening of the frame member for shielding the edge of the substrate; and
    a heater shield disposed adjacent the frame member, wherein the heater shield defines one or more recesses therein to receive one or more alignment members and has vent holes disposed through an outer portion thereof.

2. The assembly of claim 1 wherein the frame member is an annular ring and the purge gas holes are disposed outwardly of the inner lip portion.

3. The assembly of claim 2, wherein the heater shield is annular and the vent holes are disposed around the heat shield.

4. The assembly of claim 3, wherein the vent holes are disposed from an inside surface of the heater shield in fluid communication with the purge holes to an outer wall of the heater shield.

5. The assembly of claim 1 further comprising a base portion extending from the frame member for supporting the frame member on a surface.

6. The assembly of claim 5 wherein the base portion defines an inner angled centering surface.

7. The assembly of claim 5 further comprising one or more alignment members disposed on the base portion and engagable with the one or more recesses disposed in the heater shield.

8. The assembly of claim 7 further comprising a second base portion for supporting the frame member on a second surface and engagable with the one or more recesses disposed in the heater shield.

9. The assembly of claim 1 wherein the frame member and the heater shield define a space therebetween to enable a portion of purge gas flow therethrough.

10. The assembly of claim 1 wherein the heater shield further comprises:
an inner wall having an outer surface defining a purge gas passage therebetween another outer surface of a substrate support member.

11. An apparatus for processing a substrate, comprising:
a) an enclosure defining a process region;
b) a substrate support member disposed in the enclosure to support a substrate thereon;
c) a process gas inlet connected to the enclosure;
d) an exhaust system connected to the enclosure;
e) a shielding member disposed above the substrate support member, the shielding member comprising:
  1) a frame member having a plurality of purge holes disposed through the frame member; and
  2) an inner lip portion defining an inner opening of the frame member for shielding an edge of the substrate;
f) a purge gas inlet connected to deliver a purge gas adjacent the edge of the substrate; and
g) a heater shield disposed adjacent the frame member, wherein the heater shield defines one or more recesses therein to receive one or more alignment members and has vent holes disposed through an outer portion thereof.

12. The apparatus of claim 11 wherein the frame member is an annular ring and the purge gas holes are disposed outwardly of the inner lip portion.

13. The apparatus of claim 11 further comprising a base portion extending from the frame member for supporting the frame member on a surface.

14. The apparatus of claim 13 wherein the base portion defines an inner angled centering surface.

15. The apparatus of claim 14 further comprising one or more alignment members disposed on the base portion and engagable with the one or more recesses disposed in the heater shield.

16. The apparatus of claim 15 further comprising a second base portion for supporting the frame member on a second surface and engagable with the one or more recesses disposed in the heater shield.

17. The apparatus of claim 16 further comprising a support member shield disposed on a shoulder of the substrate support member.

18. The apparatus of claim 17 wherein the support member shield comprises an inner wall, an outer wall and a connecting member disposed therebetween.

19. The apparatus of claim 18 wherein the inner wall of the support member shield and the substrate support member define a purge gas passage.

20. The apparatus of claim 18 wherein the outer wall of the support member shield provides an alignment surface for aligning the heater shield.

21. The apparatus of claim 11 further comprising one or more spacing members disposed on a lower surface of the inner lip.

22. The apparatus of claim 11 wherein the support member includes a vacuum chuck.

23. The apparatus of claim 11 wherein the frame member and the heater shield define a space therebetween to enable a portion of purge gas flow therethrough.

24. The apparatus of claim 11 wherein the heater shield further comprises:
an inner wall having an outer surface defining a purge gas passage therebetween another outer surface of the substrate support member.

25. An apparatus for shielding an edge of a substrate, comprising:
a frame member having a plurality of purge holes disposed through the frame member to enable purge gas flow therethrough;
an inner lip portion defining an inner opening of the frame member for shielding the edge of the substrate;
a base portion extending from the frame member, wherein the base portion has an inner angled centering surface; and
a heater shield disposed adjacent the frame member, wherein the heater shield has vent holes disposed through an outer portion thereof.

26. The apparatus of claim 25 further comprising one or more alignment members disposed on the base portion.

27. The apparatus of claim 26 wherein the frame member and the heater shield define a space therebetween to enable a portion of purge gas flow therethrough.

28. The apparatus of claim 25 wherein the heater shield further comprises:
an inner wall having an outer surface defining a purge gas passage therebetween another outer surface of a substrate support member.

29. A method for shielding an edge of a substrate, comprising:
a) providing a shielding member disposed above the substrate, the shielding member comprising:
  1) a frame member having a base portion defining a recess therein and a plurality of purge gas holes disposed through the frame member to enable purge gas flow therethrough; and
  2) an inner lip portion defining an inner opening of the frame member for shielding the edge of the substrate;
b) providing a heater shield disposable on a shoulder of a substrate support member;
c) flowing purge gas adjacent the edge of the substrate and then through the purge gas holes; and
d) exhausting a portion of the purge gas through one or more vent holes disposed through the heater shield.

30. The method of claim 29 wherein the purge gas is flowed between about 100 sccm and about 10,000 sccm.

31. The method of claim 29 wherein the purge gas is flowed between about 500 sccm and about 3,000 sccm.

32. The method of claims 29 wherein the shielding member is disposed above the substrate at a distance between about 5 mils and about 25 mils.

33. The method of claim 29 wherein the shielding member is disposed above the substrate at a distance between about 10 mils and about 20 mils.

34. The method of claim 29 further comprising:
e) providing a substrate backside pressure between about 1.5 Torr and about 5 Torr.

35. The method of claim 29 further comprising:
e) maintaining a substrate temperature between about 170° C. and about 260° C.

36. The method of claim 29 wherein the heater shield is annular and the vent holes are disposed around the heat shield.

37. The method of claim 29 further comprising:
e) aligning the frame member with the heater shield;
   wherein the recess in the base portion has angled surfaces engagable with an outer wall of the heater shield.

38. The method of claim 29 further comprising:
e) aligning the frame member with the heater shield;
   wherein the base portion has one or more alignment members disposed thereon engagable with the one or more recesses defined by the heater shield.

39. The method of claim 29 further comprising:
e) aligning the frame member with the heater shield;
   wherein the recess in the base portion has angled surfaces engagable with an outer wall of the heater shield; and
   wherein the base portion has one or more alignment members disposed thereon engagable with the one or more recesses defined by the heater shield.

40. A method for processing a substrate, comprising:
a) providing a processing apparatus comprising:
   1) an enclosure defining a process region;
   2) a substrate support member disposed in the enclosure to support a substrate thereon;
   3) a process gas inlet connected to the enclosure;
   4) an exhaust system connected to the enclosure;
   5) a shielding member disposed above the substrate support member, the shielding member comprising:
      i) a frame member having a plurality of purge gas holes disposed through the frame member; and
      ii) an inner lip portion defining an inner opening of the frame member for shielding an edge of the substrate;
   6) a heater shield disposable on a shoulder of a substrate support member; and
   7) a purge gas inlet connected to deliver a purge gas adjacent the edge of the substrate;
b) flowing a processing gas through the gas inlet;
c) flowing a purge gas adjacent the edge of the substrate and then through the purge holes; and
d) exhausting a portion of the purge gas through one or more vent holes disposed through the heater shield adjacent the frame member.

* * * * *